(12) United States Patent
Rowell et al.

(10) Patent No.: US 8,056,819 B2
(45) Date of Patent: Nov. 15, 2011

(54) MINIATURE AND MULTI-BAND RF COIL DESIGN

(75) Inventors: Corbett R. Rowell, Mongkok (CN); Hau-Wah Lai, Laguna (HK); Chi-Lun Mak, Ma On Shan (HK)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 188 days.

(21) Appl. No.: 12/251,244

(22) Filed: Oct. 14, 2008

(65) Prior Publication Data

US 2010/0090824 A1 Apr. 15, 2010

(51) Int. Cl.
*G06K 19/00* (2006.01)
*G06K 19/06* (2006.01)
*G08B 1/08* (2006.01)
*H01Q 7/00* (2006.01)
*H01Q 21/00* (2006.01)
*H01Q 13/00* (2006.01)

(52) U.S. Cl. ............. 235/492; 235/487; 340/539.1; 340/539.11; 343/866; 343/867; 343/895; 29/600; 702/108

(58) Field of Classification Search ............ 235/487, 235/492; 343/866, 867, 895; 340/539.1, 340/539.11; 29/600
See application file for complete search history.

(56) References Cited

U.S. PATENT DOCUMENTS

| 5,237,165 | A | 8/1993 | Tingley, III |
| 5,357,958 | A * | 10/1994 | Kaufman ............... 600/410 |
| 7,057,574 | B2 * | 6/2006 | Shamir et al. ............ 343/866 |
| 7,161,542 | B2 | 1/2007 | Endo et al. |
| 7,202,668 | B2 | 4/2007 | Ludwig et al. |
| 7,268,554 | B2 | 9/2007 | Vaughan |
| 7,334,736 | B2 | 2/2008 | Uesaka |
| 7,369,028 | B2 | 5/2008 | Matsunaga et al. |
| 7,374,105 | B2 | 5/2008 | Zhu et al. |
| 7,411,559 | B2 | 8/2008 | Leinonen et al. |
| 7,414,402 | B2 | 8/2008 | Habara et al. |
| 7,417,599 | B2 | 8/2008 | Goff et al. |
| 7,420,371 | B2 | 9/2008 | Zhang |
| 7,425,924 | B2 | 9/2008 | Chung et al. |
| 7,425,929 | B2 | 9/2008 | Sako |
| 2008/0316135 | A1 * | 12/2008 | Hilgers ................... 343/795 |
| 2009/0079573 | A1 * | 3/2009 | Jiang et al. ........... 340/572.7 |
| 2009/0146902 | A1 * | 6/2009 | Li et al. ................... 343/867 |
| 2009/0224057 | A1 * | 9/2009 | Chen et al. .............. 235/492 |

* cited by examiner

*Primary Examiner* — Michael G Lee
*Assistant Examiner* — Laura Gudorf
(74) *Attorney, Agent, or Firm* — Fulbright & Jaworski L.L.P.

(57) ABSTRACT

A near field apparatus comprises a Radio Frequency (RF) coil including at least one of a shorting bridge from a first point to a second point along an electrical path of the RF coil and/or a discontinuity in the electrical path of the RF coil.

23 Claims, 10 Drawing Sheets

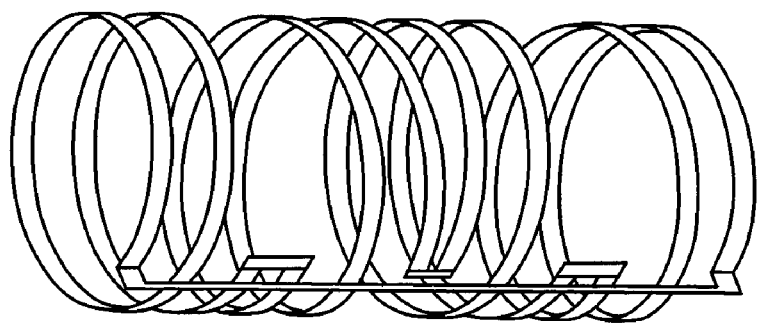
FIG. 9
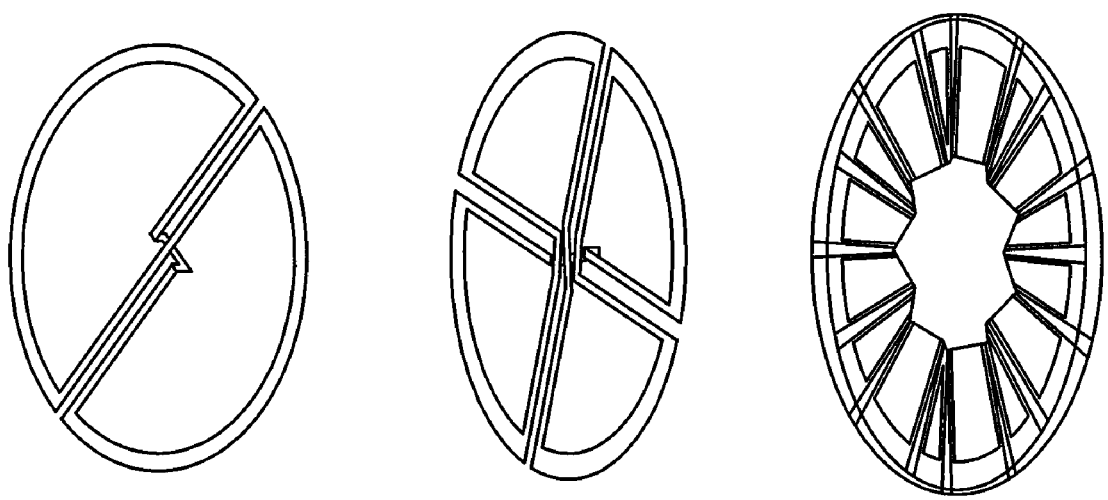
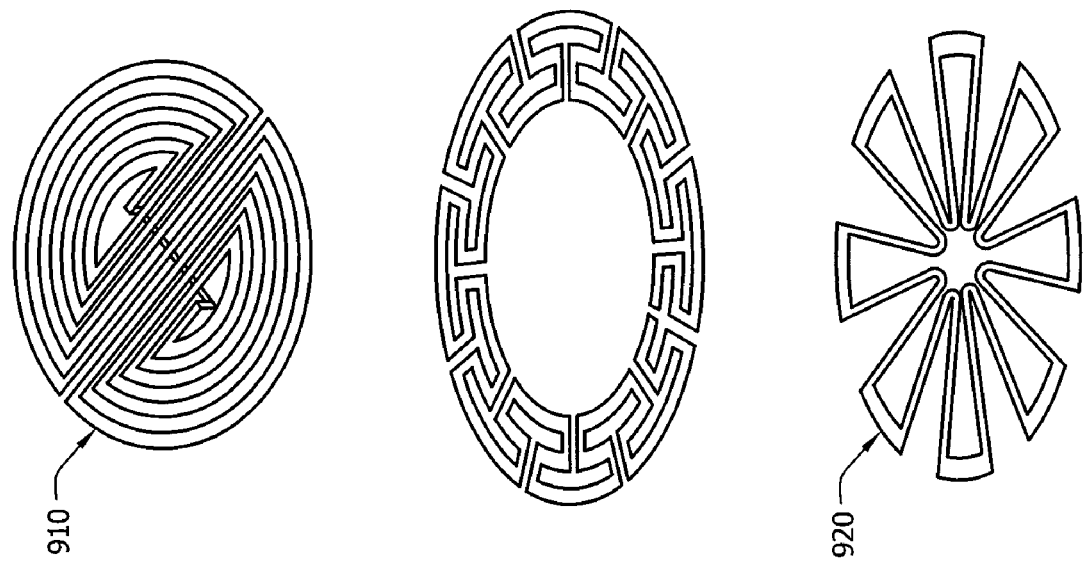

MINIATURE AND MULTI-BAND RF COIL DESIGN

TECHNICAL FIELD

The present description relates, in general, to Radio Frequency (RF) coils and, more specifically, to RF coils with new techniques to provide frequency shifting and/or impedance matching.

BACKGROUND OF THE INVENTION

For wireless communication, far field transmission and reception of electromagnetic waves is familiar, even to consumers. Applications utilizing near field energy also exist and are becoming increasingly common.

For instance, Radio Frequency Identification (RFID) applications usually employ near field transmitters and detectors. Structures used to transmit and receive near field energy are referred to as Radio Frequency (RF) coils (as opposed to antennas), and include structures such as loop coils, spiral coils, and dipole-like wires, etc. Thus, whereas the term "antenna" refers to a far field radiating structure, RF coils are understood to be for near field applications.

An outgrowth of RFID is Near Field Communications (NFC), which is an extension of the ISO 14443 standard. An NFC device typically includes an interface of a contactless smartcard and a reader and can communicate with smartcards, readers, and other NFC devices. Examples of NFC devices include phones and other handheld devices for applications like wireless payment. NFC communications, at least in the United States, use the ISM band at 13.56 MHz.

Another near field application is Magnetic Resonance Imagine (MRI). MRI machines often include RF coils to produce and/or detect the magnetic field energy that is used to image organs and structures within the body. MRI devices typically operate at about 42.58 MHz/Tesla. Therefore, operating frequency bands will be in the 63.87 MHz band and in the 127.74 MHz band for 1.5 Tesla and 3 Tesla magnetic field systems, respectively.

FIG. 13 is an illustration of conventional near field application 1300. Near field application 1300 includes RF coil 1301, which is an N-turn coil (where N is a positive integer), matching or tuning circuit 1302, transmission line 1303, and RF circuitry (e.g., a transceiver) 1305. RF circuitry 1305 receives and transmits RF signal 1304 over transmission line 1303 to circuit 1302 and RF coil 1301. Conventional RF coils typically employ an external LC circuit as a matching or tuning circuit. Furthermore, conventional RF coils use a continuous conductor so that there is an unbroken current path between the + and − coil terminals.

BRIEF SUMMARY OF THE INVENTION

Various embodiments of the invention include RF coils that have a shorting bridge and/or a current path discontinuity. For example, in one embodiment, an RF coil has a current path discontinuity (or gap) therein. The current path discontinuity adds some amount of capacitance to the RF coil, thereby affecting the frequency of operation, as well as the impedance of the coil.

In another embodiment, an RF coil includes a shorting bridge from one point on the coil to another. The shorting bridge adds some amount of inductance to the coil and affects operating frequency and impedance. Another example RF coil includes both a current path discontinuity and a shorting bridge. Embodiments of the invention include RF coils with one or more current path discontinuities and/or one or more shorting bridges thereby providing desired matching impedance as well as operation in a desired frequency band.

The use of current path discontinuities and/or shorting bridges can enable an RF coil designer to create an RF coil that has an impedance that is already matched to a transmission line. Thus, some embodiments can eliminate external LC matching circuits such as circuit 1302 of FIG. 13. Furthermore, a current path discontinuity and/or a shorting bridge can be used to shift the operating frequency of a given coil, even shifting the operating frequency downward, thereby getting a longer wavelength out of a smaller sized coil. By correct placement of the shorting bridge and/or current path discontinuity, the overall volume of the RF coil can be significantly reduced. Moreover, some embodiments provide for multi-band operations.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which:

FIG. 9 is an illustration of exemplary coil designs that can be used in various embodiments;

DETAILED DESCRIPTION OF THE INVENTION

Figure 1:
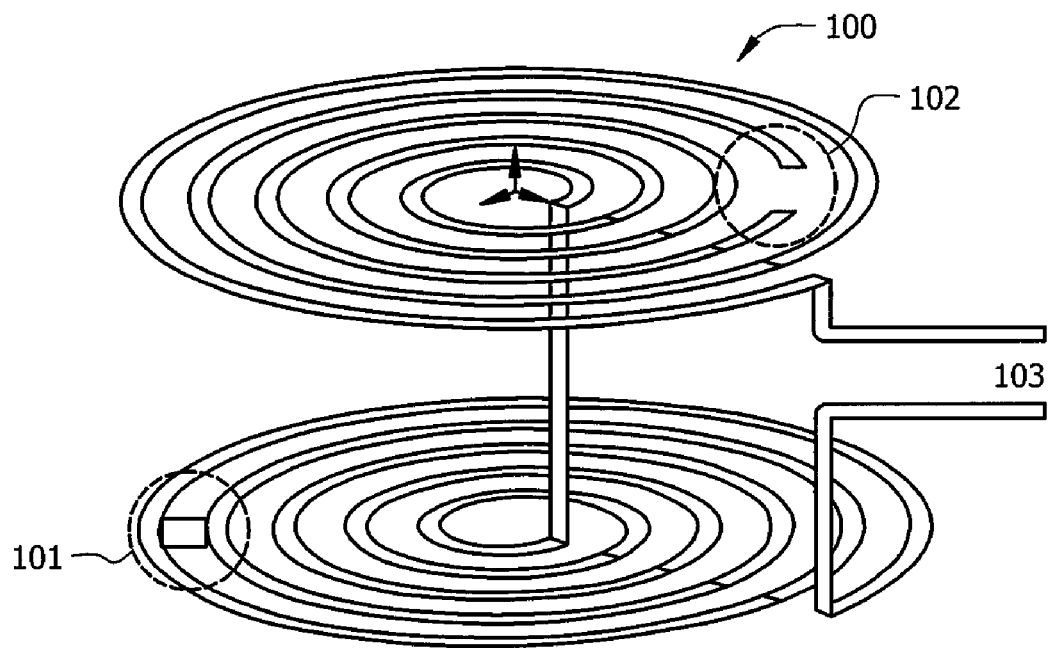
FIG. 1 is an illustration of an exemplary RF coil adapted according to one embodiment of the invention.

FIG. 1 is an illustration of exemplary RF coil 100 adapted according to one embodiment of the invention. RF coil 100 includes shorting bridge 101 and gap 102, which together affect the frequency performance of RF coil 100 as well as provide impedance matching at input/output port 103.

Figure 2:
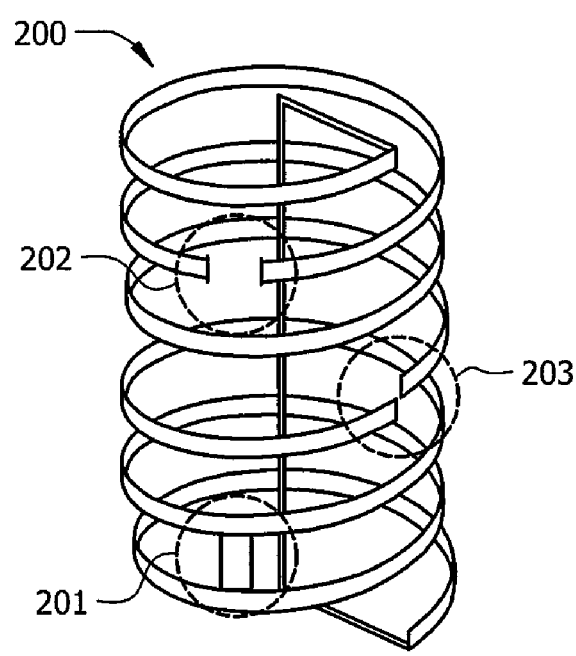
FIG. 2 is an illustration of an exemplary RF coil, adapted according to one embodiment of the invention.

The scope of embodiments is not limited to the double-layer spiral type coil shown in FIG. 1. Embodiments of the invention can be adapted for use in any shape or type of RF coil, such as coils that include any number of layers, any number of turns, any sense of rotation in the turns, etc. For instance, FIG. 2 is an illustration of exemplary RF coil 200, adapted according to one embodiment of the invention. RF coil 200 is a helical type coil that includes shorting bridge 201 and gap 202 to provide impedance matching at input/output port 203 and frequency shifting.

Nor is the scope of embodiments limited to coils that have both a gap and a shorting bridge, as some embodiments include either a gap or a shorting bridge. In fact some embodiments include two or more shorting bridges and/or gaps. The number of gaps and shorting bridges can be adapted for any given RF coil application.

RF coils adapted according to embodiments of the invention can be used in any application that transmits or detects energy in the near field. For example, embodiments of the invention can be used in RFID tags and readers, NFC cards and readers, MRI devices, and the like.

Figure 3:
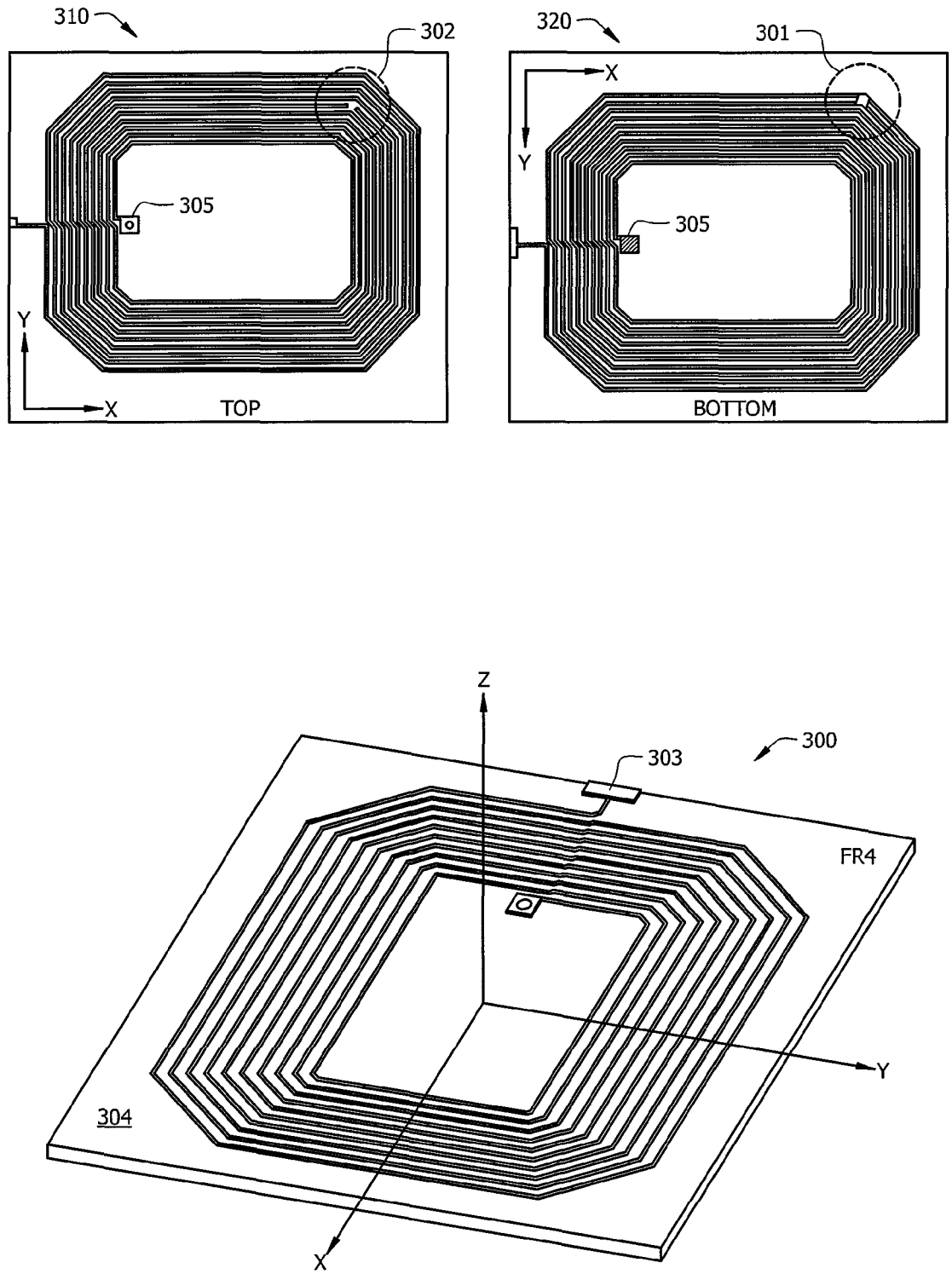
FIG. 3 is an illustration of an exemplary RF coil, adapted according to one embodiment of the invention.

FIG. 3 is an illustration of exemplary RF coil 300, adapted according to one embodiment of the invention. RF coil 300 is topologically similar to RF coil 100 (FIG. 1) in that it is a double-layer spiral coil. RF coil 300 is disposed upon Printed Circuit Board (PCB) 304 with one layer on a top surface of PCB 304 (as shown in view 310) and another layer on a bottom surface of PCB 304 (as shown in view 320). Via 305 connects the two layers by providing a conductive path through PCB 304. RF coil 300 includes input/output port 303, thereby allowing RF coil 300 to be coupled to supporting components, such as a transmission line (not shown), an RF transceiver (not shown), amplifiers, driving circuits, and/or the like. View 310 shows gap 302, which is a discontinuity in the current path of RF coil 300. View 320 shows shorting bridge 301, which connects two adjacent turns of the current path.

Figure 4:
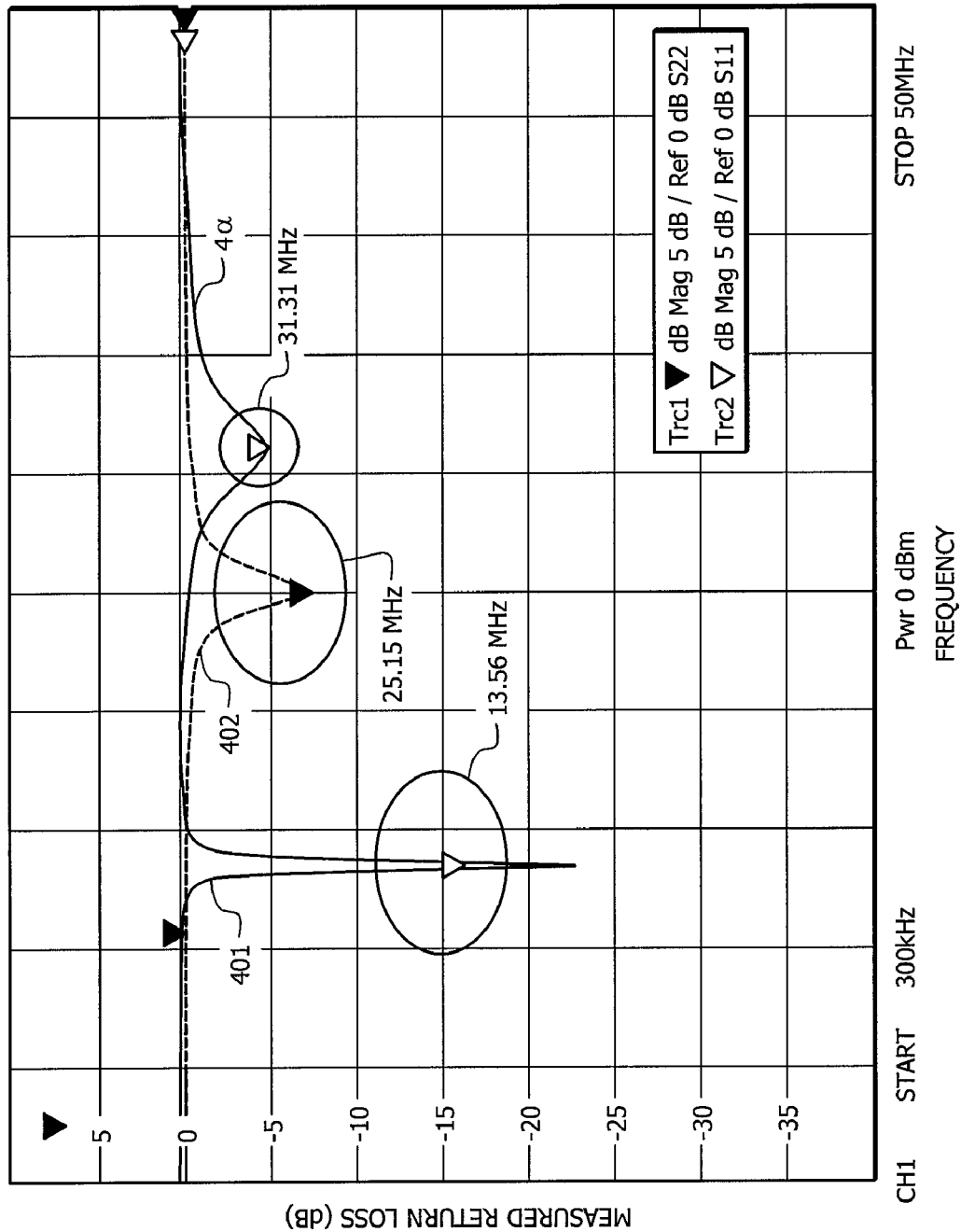
FIG. 4 shows the frequency response of a prototype built according to the embodiment of FIG. 3.

A working prototype of the embodiment of FIG. 3 has been built on a PCB where the overall physical dimensions of the form factor (including PCB) is 80×55 mm, which is a typical RFID smart card size. The operating frequency of the prototype is 13.56 MHz, such that the prototype coil can be used in an RFID tag or reader. FIG. 4 shows the frequency response of the prototype compared to a frequency response of a similar coil that does not have a gap or shorting bridge. Curve 401 shows the frequency response of the prototype (employing a gap and shorting bridge, as shown in FIG. 3). Curve 402 shows the frequency response of a similar coil that does not include a gap or shorting bridge. As can be seen, the prototype according to an embodiment of the invention experiences a frequency shift and split due to the addition of the gap and shorting bridge. Thus, the addition of the gap and shorting bridge provides performance in a lower frequency range (as well as in another higher frequency range) compared to the other design that does not have a gap or shorting bridge.

As shown in FIG. 4, the embodiment of FIG. 3 provides performance in a lower frequency band than a coil without a gap or a short, but with no increase in coil size. It is estimated that the coil of FIG. 3 occupies seventy percent less surface area than a coil of the same shape as that of the coil of FIG. 3, lacking a gap or a shorting bridge, and configured to operate in the 13.56 MHz frequency band. Thus, one advantage of some embodiments is that coils can be miniaturized. Furthermore, the frequency split can provide for multi-band performance in some embodiments.

The embodiment of FIG. 3 is shown on a PCB substrate (i.e., PCB 304). However, the scope of embodiments includes any of a variety of substrates, such as flexible PCB or films used in RFID tags, and even includes no substrate at all for some coils.

Figure 5:
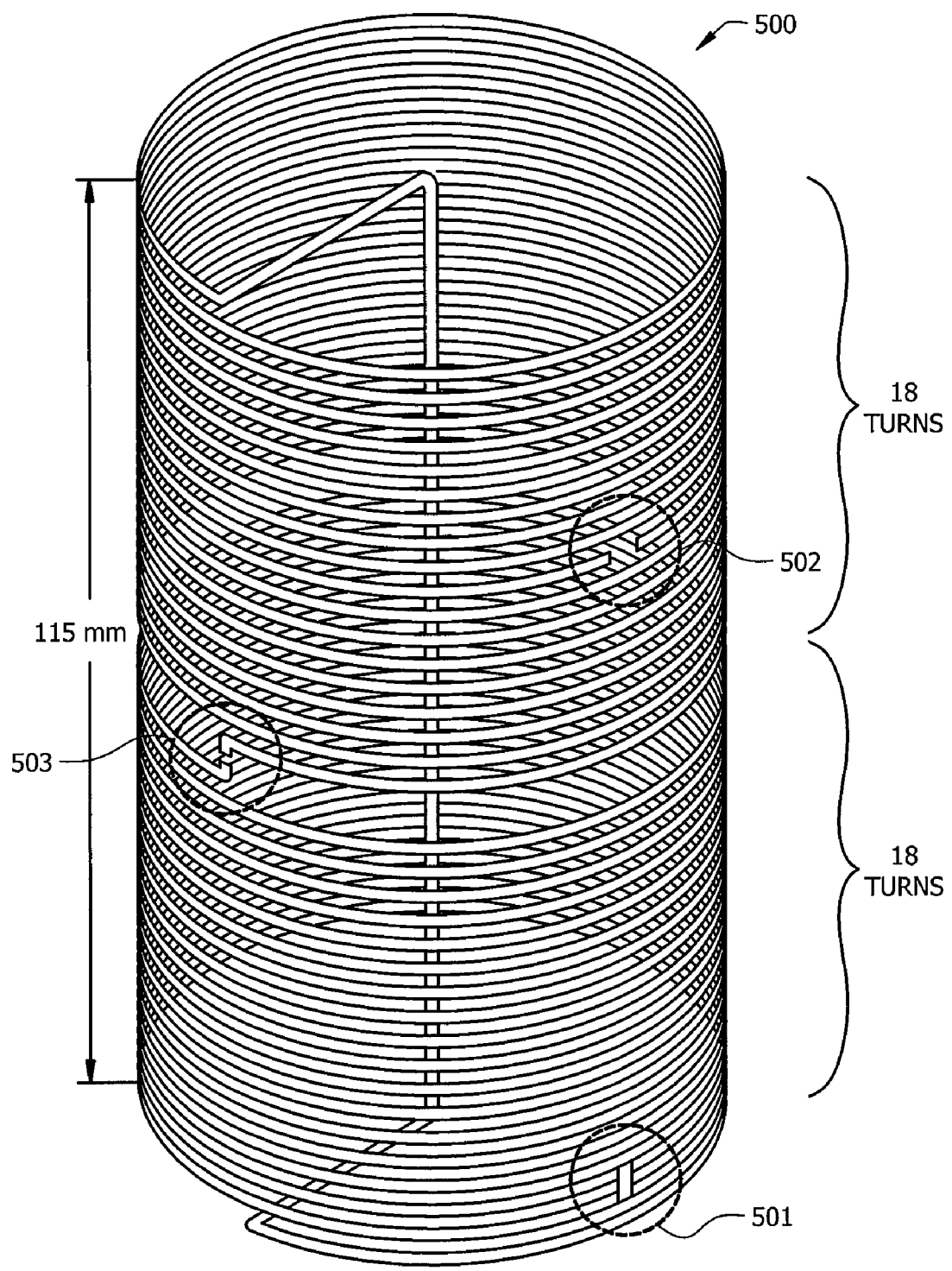
FIG. 5 is an illustration of an exemplary RF coil adapted according to one embodiment of the invention.

FIG. 5 is an illustration of exemplary RF coil 500 adapted according to one embodiment of the invention. RF coil 500 is a helical type coil that has eighteen turns above the input/output port 503 and eighteen turns below the input/output port. The dimensions are about 115 mm long with 60 mm in coil diameter. RF coil 500 includes shorting bridge 501 and gap 502.

RF coil 500 can find use in an MRI application. For instance, a body part such as a knee or a wrist, can be put inside coil 500, which transmits and detects near field energy. RF coil 500 can be scaled up or scaled down to cover other body parts, such as legs, arms, and torsos. Scaling can be accomplished by making the diameter of coil 500 either larger or smaller, such that as the diameter increases, the number of turns of coil 500 can be reduced without changing the frequency response.

Figure 6:
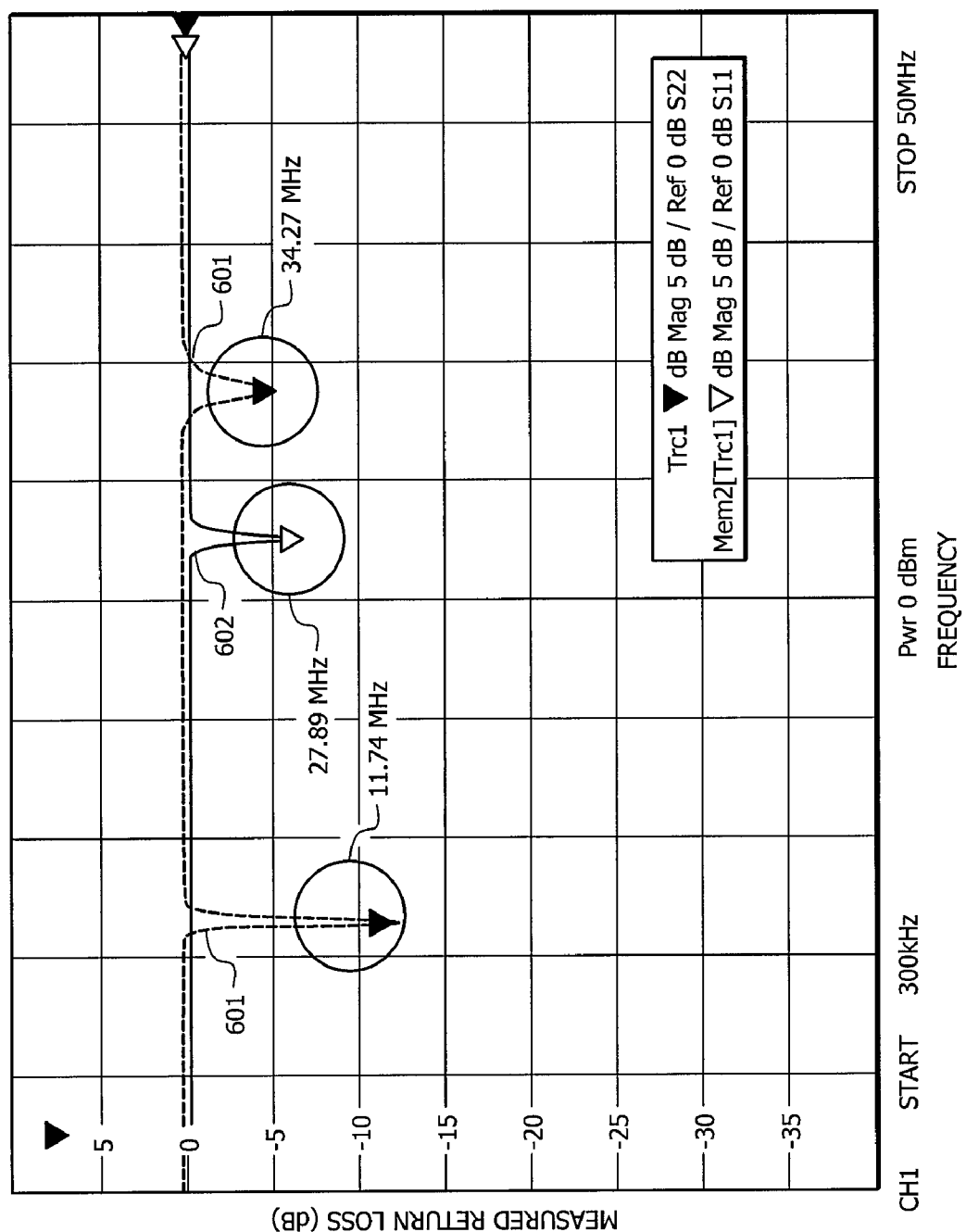
FIG. 6 is an illustration of a frequency response of a working prototype of the embodiment of FIG. 5.

FIG. 6 is an illustration of a frequency response of a working prototype of the embodiment of FIG. 5. A coil with the same dimensions as coil 500 (FIG. 5), but without a gap or shorting bridge, has a frequency response shown by curve 602. By contrast, coil 500 has a frequency response shown by curve 601. Curve 601 shows that the addition of gap 502 and shorting bridge 501 in coil 500 splits and shifts the bands of operation, providing bands of operation at 11.74 MHz and 34.27 MHz.

It is estimated that coil 500 occupies ninety percent less volume than a similarly shaped coil, without gap 502 and shorting bridge 501, configured to operate at 12 MHz. Thus, space savings is an advantage of some embodiments of the invention.

Figure 7:
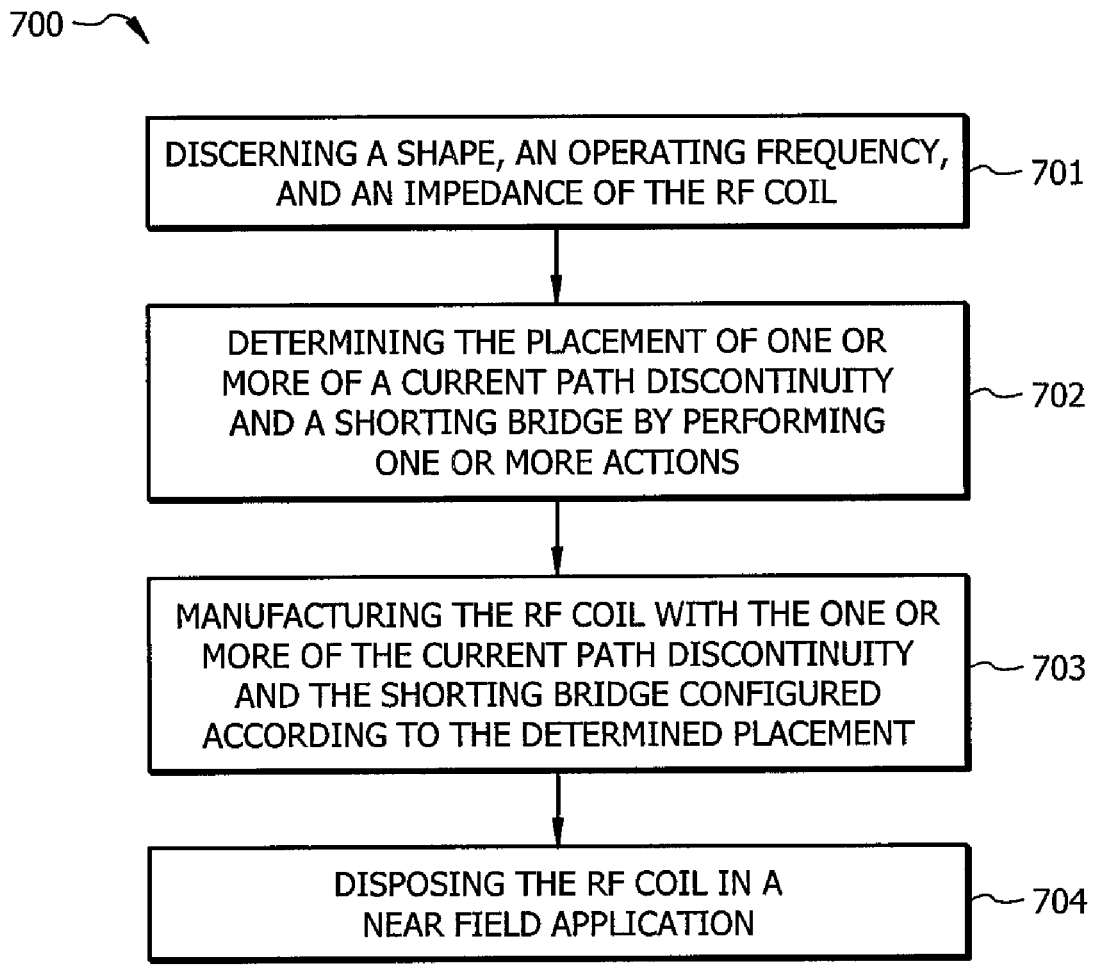
FIG. 7 is an illustration of an exemplary method adapted according to one embodiment of the invention.

FIG. 7 is an illustration of exemplary method 700 adapted according to one embodiment of the invention. Method 700 may be performed, for example, by a group of designers creating an RF coil according to embodiments herein.

In action 701, a shape, an operating frequency, and an impedance of the RF coil are discerned. Often, but not always, the shape, the impedance, and the operating frequency are dictated by the particular application for which the RF coil will be used. In such instances, discerning the shape, impedance, and operating frequency includes becoming familiar with the constraints imposed by the near field application that will use the RF coil. For instance, MRI machines typically use helical coils operating at predefined frequencies, and matching impedances of the coils are chosen to correspond to transmission lines in the supporting circuitry.

In action 702, the placement of one or more of a current path discontinuity and a shorting bridge are determined by performing one or more actions. For instance, some embodiments include making one or more computer simulations to arrive at a satisfactory placement of the gap and/or short. The first simulation can be based on a best guess, and subsequent iterations can modify the starting simulated model until desired behavior and properties are achieved. A best guess often includes placing a shorting bridge on one half of a simulation model and placing a current path gap on the other half of the model in about the same place to achieve somewhat symmetrical placement of the shorting bridge and gap.

Yet another approach employs building and testing prototypes. The first prototype can be based on a best guess, whereas subsequent prototypes modify the original design iteratively until a desired model is achieved. Other techniques combine simulation modeling and prototypes. However, the scope of embodiments is not limited to any particular technique for determining placements of current path discontinuities and/or shorting bridges.

In action 703 the RF coil is manufactured with the current path discontinuity and/or the shorting bridge configured according to the determined placement. Any appropriate manufacturing process is within the scope of embodiments. In action 704, the RF coil is disposed in a near field application, such as an MRI device, an RFID tag or reader, an NFC tag or reader, and/or the like. In one example, the RF coil is coupled to a transmission line (e.g., a coaxial line) and the line is coupled to an RF transceiver. The transceiver is further coupled to one or more processors providing signal transmission control and received signal processing/display. Various embodiments of the invention can be disposed in near field applications in the same manner as conventional RF coils (though with different matching/tuning circuits or no matching/tuning circuits). Furthermore, RF coils according to various embodiments of the present invention can be expected to perform similarly to prior art RF coils of the same operating frequency.

Method 700 is not limited to placement of both a gap and a shorting bridge. Embodiments may place a gap and/or a shorting bridge and may even place more than one of a gap and/or a shorting bridge (e.g., two gaps and three shorting bridges or two shorting bridges and no gaps). Generally, a gap adds capacitance to the RF coil while a shorting bridge adds inductance. Embodiments that include both a gap and a shorting bridge, in effect, add an LC component to the RF coil. This is in contrast to other RF coils that have external LC components and/or components loaded within the coil structure that include capacitors and inductors. Accordingly, one advantage of some embodiments is the elimination of those LC components and, correspondingly, reduced numbers of parts and manufacturing costs.

Furthermore, while method 700 is shown as a series of discrete steps, the scope of embodiments is not so limited. Embodiments can add, omit, modify, and/or rearrange the actions of method 700. For instance, action 702 can be modified to include manual mathematical calculation of the coil properties.

Figure 8:
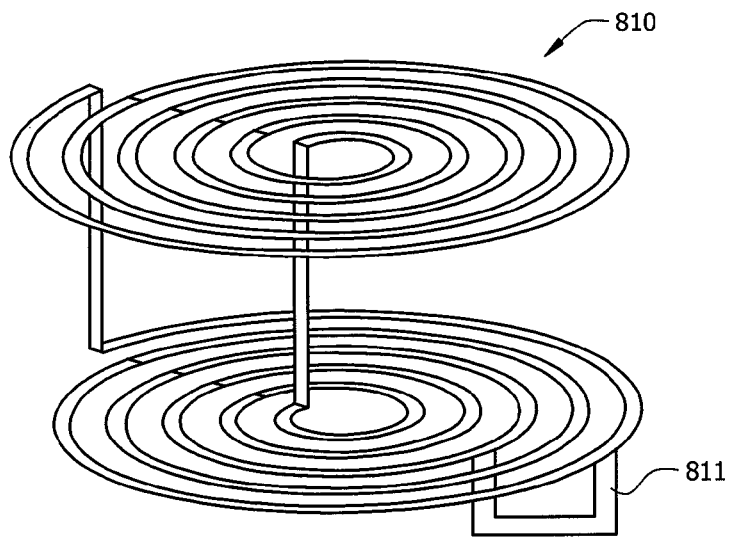
FIG. 8 is an illustration of an exemplary RF coils adapted according to embodiments of the invention.
Figure 8:
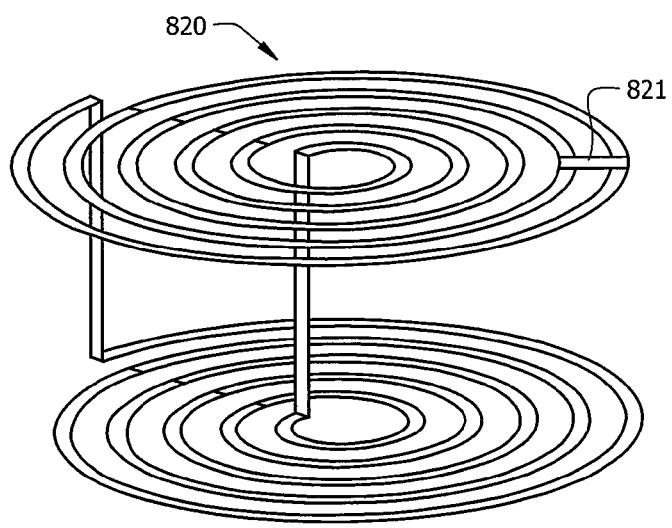
Figure 8:
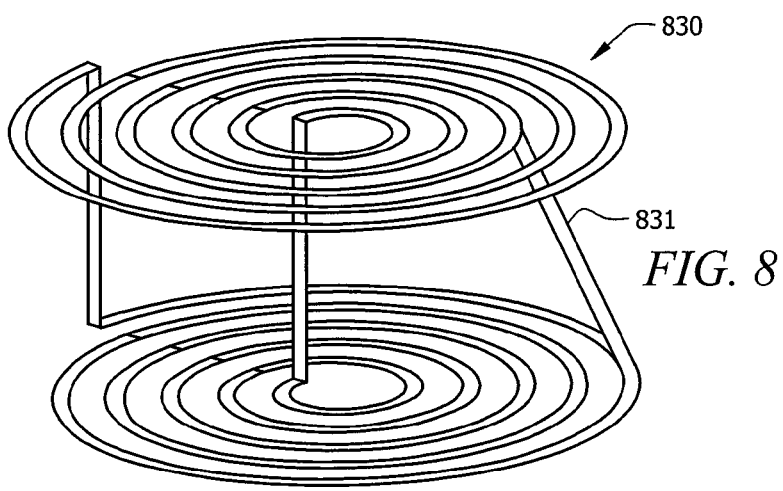

FIG. 8 is an illustration of exemplary RF coils 810, 820, and 830 adapted according to embodiments of the invention. FIG. 8 illustrates that shorting bridges, such as bridges 811, 821, and 831, can be configured in a variety of different ways. For instance, shorting bridge 821 links points in two adjacent turns of RF coil 820. Shorting bridge 811 links two points in non-adjacent turns. Shorting bridge 831 links a top half of RF coil 830 to a bottom half. The placement and length will generally affect the inductance provided by a shorting bridge. A shorting bridge can be placed anywhere in an RF coil to link two non-adjacent points if it provides desired behavior. Furthermore, the width and placement of a gap affects its capacitance, and embodiments of the invention can include a gap of any of a variety of widths or placements to provide desired behavior.

Moreover, the RF coils themselves can conform to any of a variety of designs. For example, in a spiral coil with an upper and lower half, the two halves can have the same or different rotation sense, and the number of turns in the upper and lower halves can be the same or different. FIG. 9 is an illustration of exemplary coil designs that can be used in various embodiments. For instance, coil 910 is commonly called a "butterfly" coil, and coil 920 can be referred to as a "flower" coil. Any of the coils in FIG. 9 can be used alone, with a gap and/or a shorting bridge, in various embodiments. Furthermore, the coils of FIG. 9 can be combined in three-dimensional (3D) structures, for instance, with coil 910 on top and coil 920 below it, all connected in a current path. Gaps and/or shorting bridges can be distributed among the parts of the 3D structure.

Figure 10:
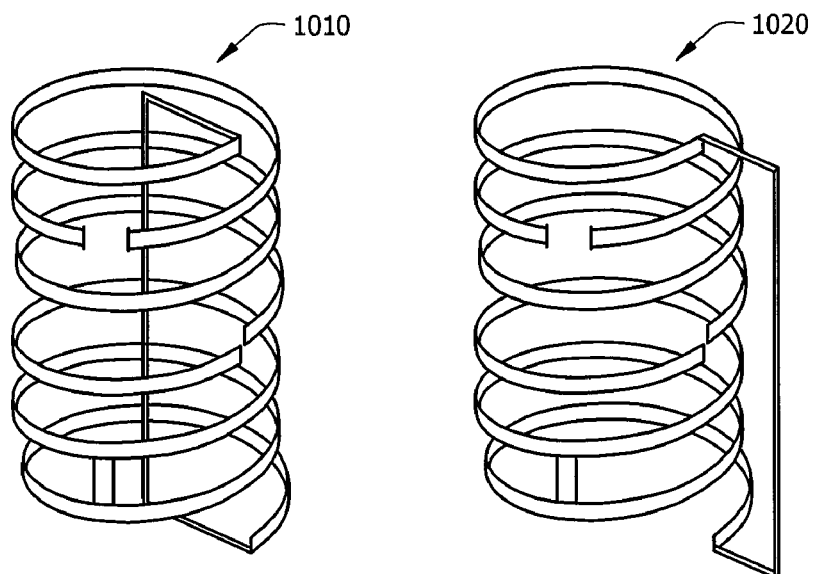
FIG. 10, is an illustration of exemplary coils adapted according to embodiments of the invention.

Further, in many embodiments, the connections of the two ends of the current paths can be inside or outside of a structure, as in FIG. 10, which illustrates exemplary coils 1010 and 1020 adapted according to embodiments of the invention. In RF coil 1010, the ends of the current path are connected inside, whereas in RF coil 1020, the ends of the current path are connected outside. Such distinction does not typically affect performance of an RF coil, though it can impact usability of the RF coil as it is applied to a near field application. For instance, for an MRI coil that fits around a body part, a designer may prefer to connect to two ends of the current path outside of the coil, since the body part will fit inside. Furthermore, input/output ports are often connected to the current path at the place where the two ends of the current path are connected, and it can sometimes be more convenient to place a port outside, rather than inside, a 3D structure.

Figure 11:
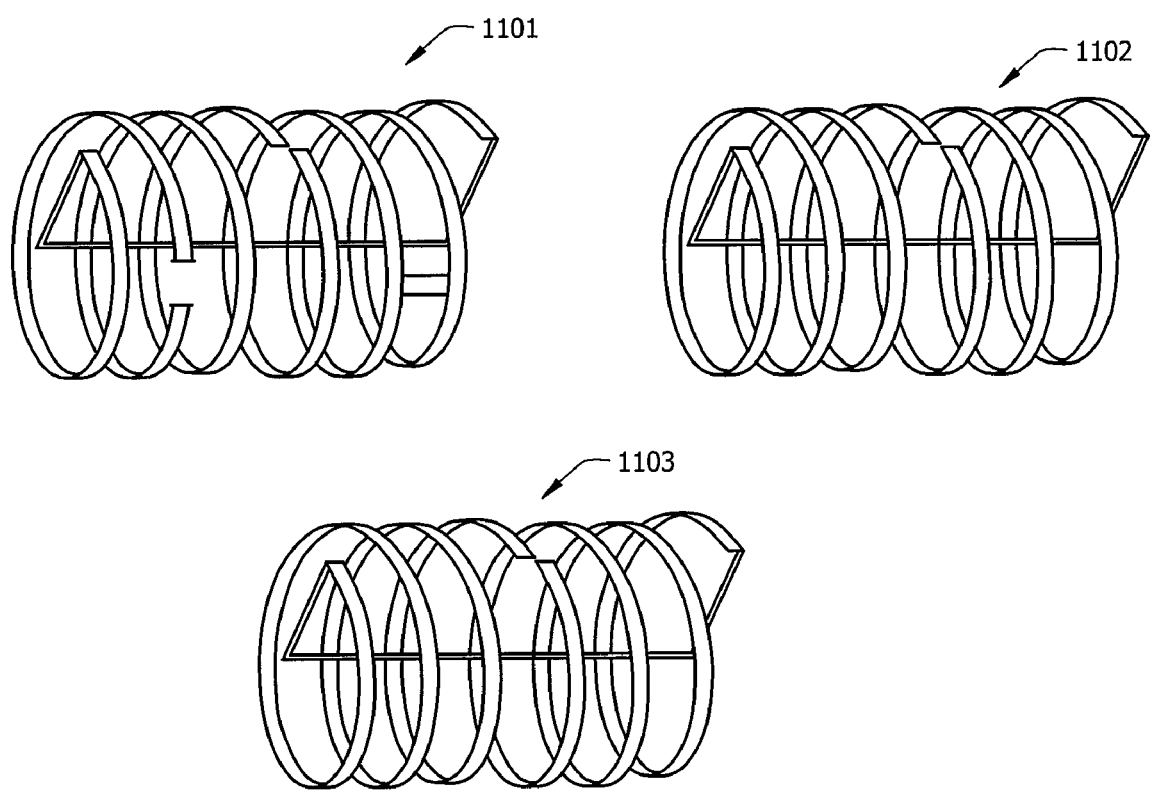
FIG. 11 is an illustration of an exemplary RF coil array adapted according to one embodiment of the invention.

FIG. 11 is an illustration of exemplary RF coil array 1100 adapted according to one embodiment of the invention. For a given array, such as array 1100, a gap and/or shorting bridge can be placed in a single coil only. Alternatively, each coil in the array may include a gap and/or a short. Still further, gaps and/or shorting bridges can be distributed in any desirable way amongst the coils in the array. For instance, in array 1100, coil 1101 includes a gap and a shorting bridge, but coils 1102 and 1103 do not include a gap or a shorting bridge. An example MRI system can use a coil array, such as array 1100, to cover the whole body instead of using one large loop.

Figure 12:
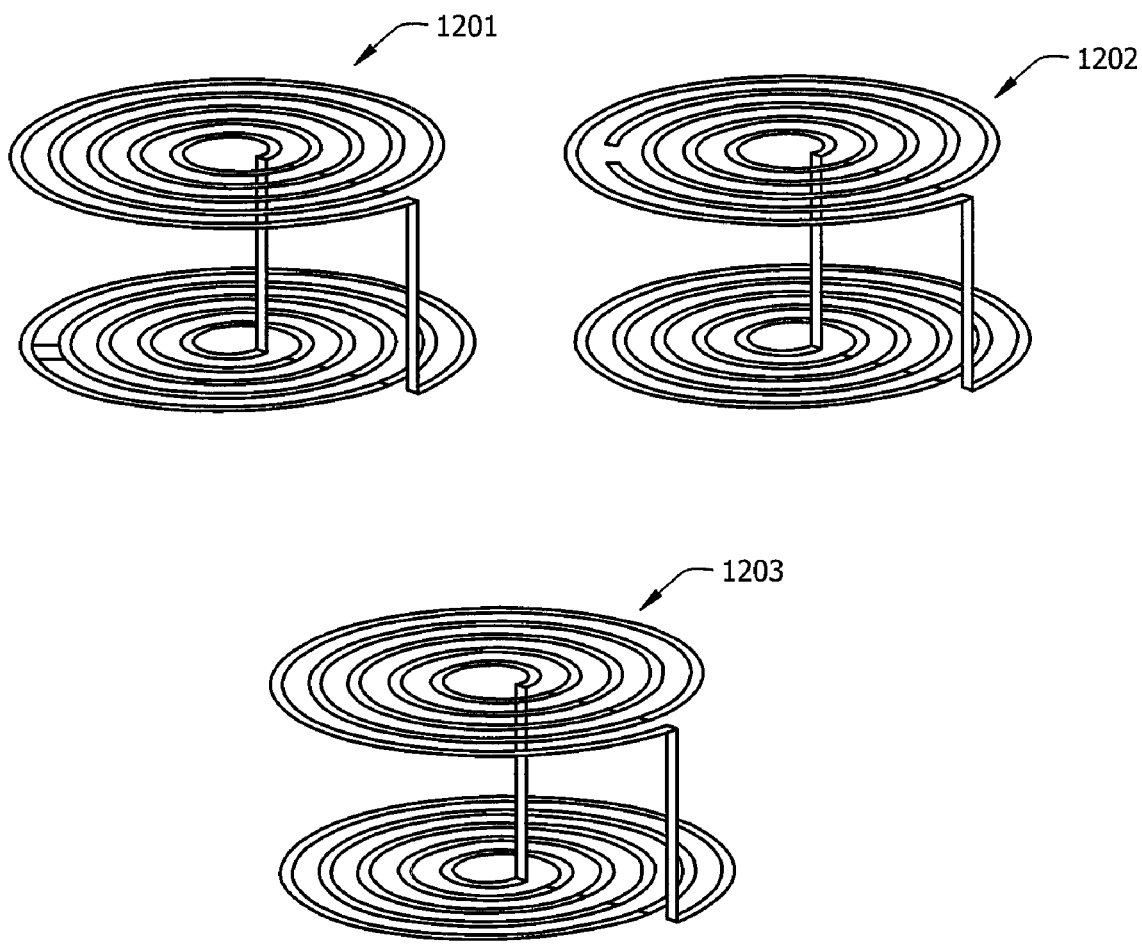
FIG. 12 is an illustration of an exemplary RF coil array adapted according to one embodiment of the invention.
Figure 13:
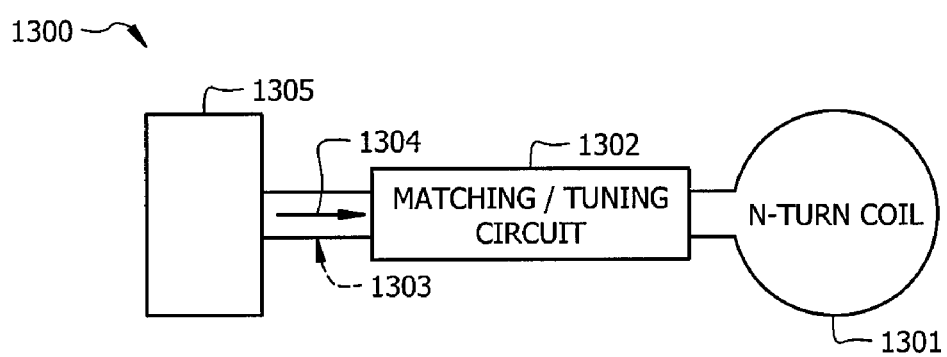
FIG. 13 is an illustration of a conventional near field application.

FIG. 12 is an illustration of exemplary RF coil array 1200 adapted according to one embodiment of the invention. Array 1200 is an array of spiral type RF coils, and the principle is the same as that of array 1100. Array 1200 includes a gap in RF coil 1202 and a shorting bridge in RF coil 1201. While not shown here, different types of coils (e.g., helical and spiral) can be combined in any of a variety of arrays.

Various embodiments of the invention offer advantages over the prior art. As mentioned above, embodiments provide a way to produce near field radiation in a given frequency band with a smaller coil than prior art embodiments provide. Furthermore, some embodiments provide a technique for adding inductance and/or capacitance to a coil other than by an external LC circuit or direct loading the capacitor or inductor within the coil.

Moreover, it should be noted that embodiments of the invention that employ a current path gap are new and revolutionary. Conventional thinking holds that RF coils should have continuous current paths, and embodiments of the invention directly contradict this long-held belief.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A near field apparatus comprising:
  a near field Radio Frequency (RF) coil including:
    a shorting bridge from a first point to a second point along an electrical path of the RF coil; and
    a discontinuity in the electrical path of the RF coil; and
  a transmission line input and output to the RF coil, wherein an impedance of the RF coil matches an impedance of the transmission line input and output.

2. The near field apparatus of claim 1 further comprising:
  an RF transmitting module supplying RF energy to the RF coil via the transmission line input and output, the RF transmitting module configured to provide RF energy at a frequency that produces near field energy at the RF coil.

3. The near field apparatus of claim 1 further comprising:
  a plurality of other RF coils forming an array.

4. The near field apparatus of claim 1 wherein the RF coil comprises a double-layer spiral type coil on a Printed Circuit Board (PCB) substrate.

5. The near field apparatus of claim 1 wherein the RF coil comprises a double-layer spiral type coil on a flexible substrate.

6. The near field apparatus of claim 1 wherein the RF coil comprises a helical coil.

7. The near field apparatus of claim 1 comprising one or more of the following items selected from the list consisting of:
  a Radio Frequency Identification (RFID) device;
  a Near Field Communications (NFC) device; and
  an MRI device.

8. A method for creating a Radio Frequency (RF) coil that includes one or more of a shorting bridge within the RF coil's current path and a current path discontinuity within the RF coil to provide a selected operating frequency and impedance, said method comprising:
  determining the placement of the one or more of a current path discontinuity and a shorting bridge by performing one or more actions selected from the list consisting of:
  creating one or more computer simulations of the RF coil to arrive at a placement of the one or more of a current path discontinuity and a shorting bridge that satisfies the selected operating frequency and the selected impedance; and
  creating and testing one or more prototypes of the RF coil to arrive at a placement of the one or more of a current path discontinuity and a shorting bridge that satisfies the selected operating frequency and the selected impedance;
  manufacturing the RF coil with the one or more of the current path discontinuity and the shorting bridge configured according to the determined placement; and disposing the RF coil in a near field application.

9. The method of claim 8 wherein the near field application comprises an MRI machine.

10. The method of claim 8 wherein the near field application comprises an RFID tag.

11. The method of claim 8 wherein the near field application comprises an RFID reader.

12. The method of claim 8 wherein the near field application comprises an NFC transmitter.

13. The method of claim 8 wherein the near field application comprises an NFC reader.

14. A near field Radio Frequency Identification (RFID) device comprising:
  a miniaturized near field Radio Frequency (RF) coil that includes a current path with a shorting bridge and a discontinuity in the current path of the RF coil providing impedance matching and frequency shifting for the RF coil; and
  supporting circuitry in the RFID device facilitating one or both of transmission and detection of RF energy by the RF coil.

15. The near field RFID device of claim 14 comprising:
  a Near Field Communication (NFC) device.

16. The near field RFID device of claim 15 comprising:
  a cellular phone.

17. The near field RFID device of claim 14 comprising:
  a near field Radio Frequency Identification (RFID) tag.

18. The near field RFID device of claim 17 wherein the RF coil comprises a double-layer spiral type coil on a flexible substrate.

19. The near field RFID device of claim 14 the RF coil comprises a double-layer spiral type coil on a Printed Circuit Board (PCB) substrate.

20. A Magnetic Resonance Imaging (MRI) apparatus comprising:
  a near field Radio Frequency (RF) coil that includes a current path with a shorting bridge and a discontinuity in the current path of the RF coil providing impedance matching and frequency shifting for the RF coil; and
  supporting circuitry in the MRI machine facilitating one or both of transmission and detection of RF energy by the RF coil.

21. The MRI apparatus of claim 20 wherein the RF coil comprises a helical coil.

22. The MRI apparatus of claim 20 further comprising:
  a plurality of other RF coils forming an array with the RF coil.

23. The MRI apparatus of claim 20 wherein the RF coil comprises a helical coil adapted to accommodate a human body part therein.

* * * * *